US006342994B1

United States Patent
Cousy et al.

(10) Patent No.: US 6,342,994 B1
(45) Date of Patent: Jan. 29, 2002

(54) PROTECTIVE DEVICE AGAINST EXCESSIVE CURRENTS, IN PARTICULAR FOR RESETTABLE PROTECTION OF A CONTROLLED SWITCH

(75) Inventors: Jean-Pierre Cousy, Verneuil sur Vienne; Serge Batongue, Andresy, both of (FR)

(73) Assignees: Legrand; Legrand SNC, both of Limoges (FR)

( * ) Notice: Subject to any disclaimer, the term of this patent is extended or adjusted under 35 U.S.C. 154(b) by 0 days.

(21) Appl. No.: 09/367,351

(22) PCT Filed: Dec. 7, 1998

(86) PCT No.: PCT/FR98/02643

§ 371 Date: Feb. 4, 2000

§ 102(e) Date: Feb. 4, 2000

(87) PCT Pub. No.: WO99/31778

PCT Pub. Date: Jun. 24, 1999

(Under 37 CFR 1.47)

(30) Foreign Application Priority Data

Dec. 12, 1997 (FR) .............................................. 97 15783

(51) Int. Cl.⁷ ................................................ H02H 5/04
(52) U.S. Cl. .......................... 361/24; 361/58; 361/91.8; 361/106
(58) Field of Search ............................. 361/23, 24, 29, 361/31, 57, 58, 93.1, 93.8, 93.9, 91.8, 103, 106

(56) References Cited

U.S. PATENT DOCUMENTS

| 3,555,355 A | * | 1/1971 | Pfister et al. ................... 361/33 |
| 3,846,674 A | * | 11/1974 | McNulty ....................... 361/33 |
| 3,868,549 A | * | 2/1975 | Schaefer et al. ............... 361/11 |
| 5,451,853 A |   | 9/1995 | Itoh ............................. 361/26 |

FOREIGN PATENT DOCUMENTS

| GB | 2 055 264 | 2/1981 | ............ H02H/3/08 |
| WO | WO 93/07667 | 4/1993 | ............ H02H/3/08 |
| WO | WO 97/10636 | 3/1997 | ............ H02H/9/02 |
| WO | WO 97/10637 | 3/1997 | ............ H02H/9/02 |

* cited by examiner

*Primary Examiner*—Ronald W. Leja
(74) *Attorney, Agent, or Firm*—Young & Thompson

(57) ABSTRACT

A protective device against excessive currents occurring in an electric circuit between a voltage source and a load mounted downstream of said device, comprising a first triggering component with high current sensitivity and adapted to be triggered, rapidly, but reversibly, in case of excessive current in the circuit, and a second triggering component, mounted in parallel with the first, capable of bearing a temporary voltage higher than the power supply voltage, when the first component is triggered, and of being triggered rapidly and reversibly thereafter. The triggering component are preferably conductive polymer components. Also, a triac switch comprising such a protective device mounted upstream of the triac and a third component is mounted on the triac trigger.

7 Claims, 1 Drawing Sheet

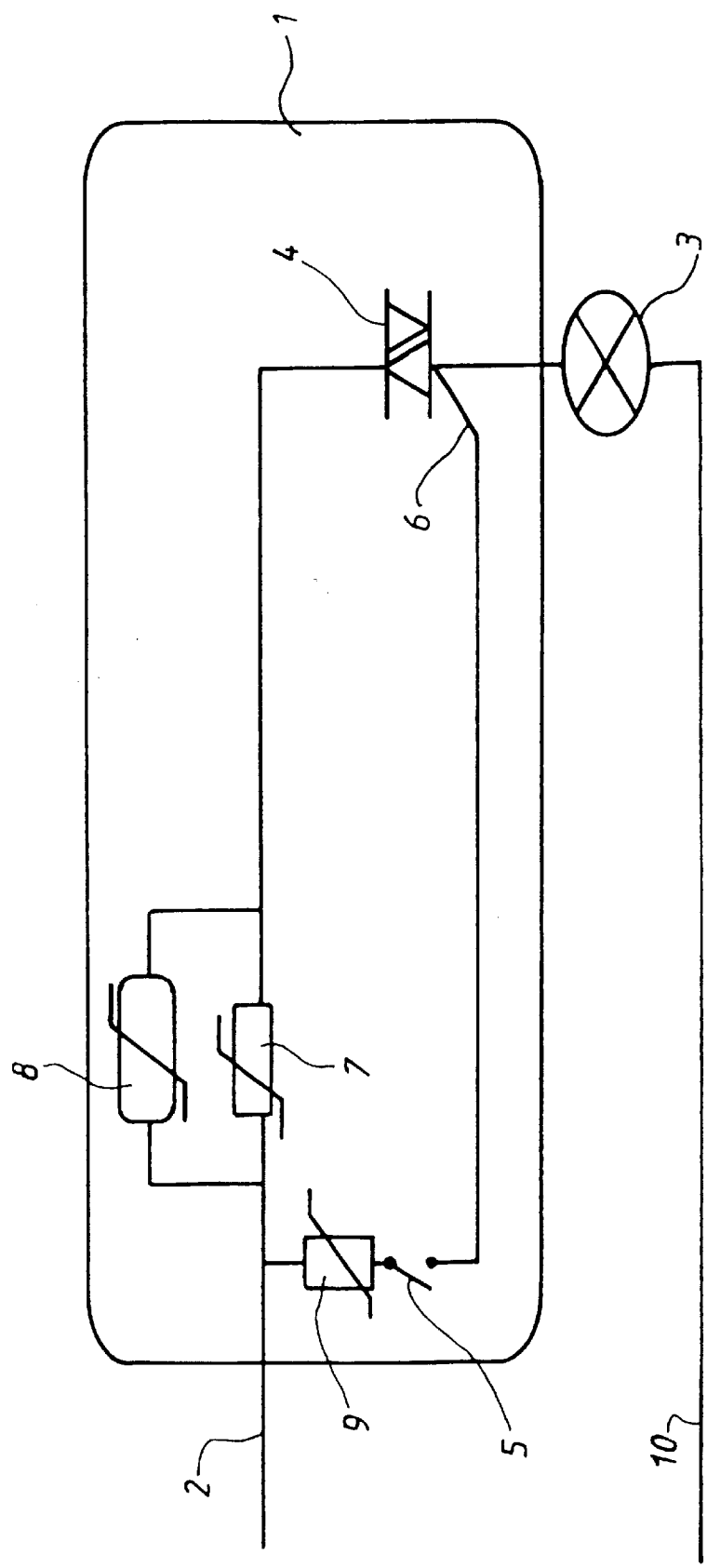

PROTECTIVE DEVICE AGAINST EXCESSIVE CURRENTS, IN PARTICULAR FOR RESETTABLE PROTECTION OF A CONTROLLED SWITCH

The invention concerns a resettable device for protecting electrical circuits against overcurrents. It is more particularly concerned with a resettable self-protected electrical switch for low-voltage electrical power supplies.

BACKGROUND OF THE INVENTION

Ordinary electrical devices such as motors, transformers, batteries, domestic appliances and electronic circuits can be protected by materials with a non-linear electrical resistance, such as zinc oxide in the case of overvoltages. Protection against overcurrents is conventionally provided by fuses, and is non-reversible, the fuse having to be changed after use, or can be provided by mechanical devices such as resettable circuit-breakers.

SUMMARY OF THE INVENTION

A main object of the invention is a new device for protection against overcurrents in an electrical circuit. A second aim of the invention is for the device to automatically become conductive again after the overcurrent has ceased. A very simple circuit with a low cost to manufacture constitute a third objective of the invention.

To this end, the invention proposes a device protecting against overcurrents in an electrical circuit between a voltage supply and a load downstream of said device, said device including means having a high current sensitivity and adapted to be tripped (i.e. to change from a conductive state to a virtually non-conductive state) fast, but reversibly, in the event of an overcurrent in the circuit, and second means connected in parallel with the first means, adapted to withstand a temporary voltage higher than the mains voltage when the first means trip and to trip quickly and reversibly after the latter.

Clearly, this arrangement separates the stresses of fast tripping in the presence of an overcurrent, on the one hand, and of transfer of voltage corresponding to the mains supply, i.e. 230 V, on the other hand, using two separate components mounted in parallel and operating one after the other in the event of tripping in response to an overcurrent.

The reversibility of tripping is naturally a necessity if the protection device must be resettable.

The tripping means are preferably resistors whose resistivity increases reversibly by several orders of magnitude with temperature, and the first component has a very low resistance when in the conductive state compared to the resistance of the second component when in the conductive state.

To be more precise, the tripping means are groups of positive temperature coefficient (PTC) charged conductive polymer components.

These components are available off the shelf at low cost and have a resistance that varies by several orders of magnitude when the internal temperature of the component increases a few tens of degrees, and can therefore be used in a circuit of the above kind. Their use enables the economic fabrication of overcurrent protection devices.

Also, in this case, resetting of the protection device is automatic. As soon as the temperature of the polymer components falls back to the normal ambient temperature, they become conductive again and the circuit is made.

The invention is also directed to an electronic switch including a triac including a protection device as defined above connected in series on the input side of the triac.

A switch of the above kind is protected against overcurrents, there remaining only a current of a few milliamperes after tripping of the two variable resistance polymer components. It can then be desirable to eliminate the residual current in the circuit completely, for safety reasons and to allow the polymer components to cool.

To this end, a third PTC conductive polymer component is preferably mounted between the trigger of the triac and the voltage supply, this third component having a high resistance when in the conductive state relative to the resistance of the first component when in the conductive state.

According to various features of the invention, which can possibly be used conjointly:

the resistance of the first component in the conductive state is approximately 200 milli-ohms and the resistance of the second component in the conductive state is approximately 10 ohms;

the first component has a holding current of a few amperes at 20° C.

the second component has a holding current of approximately 0.1 ampere at 20° C.

These features are favorable to the fabrication of a current protection device for a conventional switch using components available off the shelf at low cost.

The description and the drawing of a preferred embodiment of the invention given hereinafter explain the aims and advantages of the invention. Clearly the description is given by way of example only and is not limiting on the invention.

BRIEF DESCRIPTION OF THE DRAWING

The sole FIGURE is a schematic of the electrical circuit of a self-protected electronic switch in accordance with the invention.

DETAILED DESCRIPTION OF THE PREFERRED EMBODIMENTS

Remember first that charged conductive polymer components are available off the shelf. These positive temperature coefficient (PTC) components have the characteristic that their resistivity increases greatly with temperature (this phenomenon is known as "tripping" of the component), with a very sudden variation (of three to four orders of magnitude) when a so-called percolation threshold is reached, corresponding to a critical temperature.

The percolation temperature is defined by a holding current, which is the current below which the component never trips, and a tripping current, which is the current above which the component always trips. These two current values depend on the temperature. The polymer components are supplied with, among others, values characterizing their holding and tripping current at 20° C., curves showing these currents as a function of temperature, and their tripping time as a function of the current in the component.

The polymer component therefore goes to the non-conductive state above the percolation threshold and the voltage across it is then similar to the voltage applied to the circuit, but the current is limited to a few milliamperes. The polymer component remains substantially non-conductive until the temperature falls because the current is no longer flowing. It then reverts to the conductive state.

The electronic circuit of a self-protected electronic switch 1 constituting one embodiment of the invention (overcurrent protection of a triac switch) comprises only a few components, as can be seen in the FIGURE. The self-protected electronic switch 1 is based on modifying a switching cell for a 230 V AC circuit. The cell is mounted between a voltage supply 2 and a load 3 to be controlled and protected and conventionally comprises a triac 4, for example a triac of the conventional 12A type, and a manual switch 5 operated by the user and upstream of the trigger 6 of the triac.

In the preferred embodiment of the device in accordance with the invention, a first polymer component 7, for example a Raychem RXE 110 Polyswitch, which has a resistance in the conductive state of 200 milli-ohms, a holding current of 1.1 A at 20° C. and a tripping current of 2.2 A at 20° C., is mounted upstream of the triac 4. This component withstands a limit voltage of 60 V.

A second polymer component 8 is connected in parallel in order to be in a position to withstand the voltage of 230 V across the first polymer component 7, which is highly sensitive to current when it becomes resistant. It is a PSR 20963 Polyswitch. It has a resistance in the conductive state of 13 to 26 ohms, a holding current of 110 mA at 20° C. and a tripping current of 165 mA at 20° C. This component withstands a limit voltage of 250 V.

Finally, a third polymer component 9 is connected upstream of the manual switch 5 and the trigger 6 of the triac 4. It is a PSR 21017 polyswitch which has a resistance in the conductive state of 27 to 56 ohms, a holding current of 69 mA at 20° C. and a tripping current of 110 mA at 20° C. This component withstands a limit voltage of 300 V.

The above components are housed in a conventional switch housing, not shown in the figure, recessed into a wall, for example.

In use, under normal current conditions, with a current of 4 A flowing in the load at 230 V, for example (corresponding to a consumption of 900 W by the load), the first polymer component 7, which has a low resistance (200 milli-ohms), does not interfere with the operation of the triac and does not generate any significant heat (0.8 W in this example).

The third conductive polymer component 9 at the trigger of the triac 4 has a very low resistance that does not interfere with the operation of the triac and produces a very low opening angle (less than 1°), which is indispensable for conformity with standard EN 55022 on induced electromagnetic interference.

If there is an overcurrent in the circuit, for example with a fault current of a few amperes beyond the normal current, the current flowing in the first polymer component 7 causes a sudden increase in the temperature of that component, which causes it to trip and its resistance to change by several orders of magnitude. Here the temperature rises to 80° C. in a few seconds, with the resistance simultaneously increasing to around 1 000Ω. The first polymer component 7 therefore becomes virtually non-conductive and the voltage across it rises to 230 V. The current them flows in the second polymer component 8.

The second polymer component 8 connected in parallel with the first polymer component 7 is chosen to trip only after the first polymer component 7 has changed state, and then as quickly as possible. Its resistance of 13 to 26Ω causes it to be heated up very quickly by a low current after the first polymer component 7 trips and therefore to trip itself. In contrast, the second polymer component 8 is chosen from a range which supports voltages up to 250 V and is therefore adapted to withstand a voltage that the in-line first polymer component 7 could not withstand itself, so that it would become unusable after an overcurrent if it were used on its own in the circuit. The benefit of the second polymer component 8 is that it withstands voltages higher than those of the conventional low-voltage mains power supply, but it has too high a resistance to be connected in series with the triac on its own, because of its excessively high heat dissipation. Also, this type of polymer is marketed for low nominal current values.

The circuit therefore withstands the transfer of voltage when the protection system is tripped.

However, the current limitation provided by the first and second polymer components 7 and 8 connected in parallel is insufficient to turn off the triac 4, because of heating of the triac, even if the residual current of a few milliamperes is less than its holding current (current below which it normally turns off).

This drawback is alleviated by providing the third polymer component 9 upstream of the trigger 6 of the triac 4 in the circuit. When the first and second polymer components 7 and 8 have tripped, current is transferred to the trigger 6 of the triac 4. The current trips the third polymer component 9, which becomes non-conductive in turn at the end of a temperature rise and resistance increase time. This turns off the triac 4. The third polymer component 9 must trip as fast as possible to turn off the triac 4 and to transfer to the terminals of said triac 4 the voltage of the mains power supply across the second and third polymer components 8, 9.

When the fault current is no longer present, the first, second and third polymer components 7, 8 and 9 cool and then become conductive again. The device is therefore automatically reset at the end of the cooling time of the polymer components 7, 8 and 9. The circuit is then operational again.

The scope of the present invention is not limited to the details of the embodiments described above by way of example but to the contrary encompasses modifications that will suggest themselves to the skilled person.

What is claimed is:

1. An electronic switch comprising:
   a) a triac,
   b) a device protecting against overcurrents in an electrical circuit between a voltage supply and a load downstream of said device, said device being connected in series upstream of the triac and including:
   first tripping means having a high current sensitivity and adapted to be tripped (i.e. to change from a conductive state to a virtually non-conductive state) fast, but reversibly, in the event of an overcurrent in the circuit, and
   second tripping means connected in parallel with the first tripping means, adapted to withstand a temporary voltage higher than a mains voltage when the first tripping means trips and trips quickly after the first tripping means; and
   c) third tripping means between the trigger of the triac and the voltage supply.

2. An electronic switch according to claim 1, wherein the first, second and third tripping means are components whose resistivity increases by several orders of magnitude with temperature, reversibly, and the first tripping means has a very low resistance when in the conductive state compared to the resistance of the second tripping means when in the conductive state.

3. An electronic switch according to claim 2, wherein the first, second and third tripping means comprise respective first, second and third positive temperature coefficient charged polymer components.

4. An electronic switch according to claim 3, wherein the third tripping means has a high resistance when in the conductive state compared to the resistance of the first polymer component when in the conductive state, in order to withstand the transfer of voltage.

5. A device according to claim 3, wherein the resistance of the first polymer component when in the conductive state is approximately 200 milli-ohms and the resistance of the second polymer component when in the conductive state is approximately 13 to 26 ohms.

6. A device according to claim 3, wherein the first polymer component has a holding current of a few amperes at 20° C.

7. A device according to claim 3, wherein the second polymer component has a holding current of approximately 0.1 ampere at 20° C.

* * * * *